United States Patent [19]

Voss

[11] 4,060,826
[45] Nov. 29, 1977

[54] LIGHT ACTIVATED THYRISTOR CAPABLE OF ACTIVATION BY INTENSITY RADIATION

[75] Inventor: Peter Voss, Munich, Germany

[73] Assignee: Siemens Aktiengesellschaft, Munich, Germany

[21] Appl. No.: 710,972

[22] Filed: Aug. 2, 1976

[30] Foreign Application Priority Data

Aug. 29, 1975 Germany .............................. 2538549

[51] Int. Cl.$^2$ ............................................. H01L 29/74
[52] U.S. Cl. ...................................... 357/38; 357/20; 357/30; 357/68; 357/86
[58] Field of Search ...................... 357/20, 38, 30, 86, 357/68

[56] References Cited

U.S. PATENT DOCUMENTS

| 3,697,833 | 10/1972 | Nakata | 357/38 |
| 3,731,162 | 5/1973 | Suenaga | 357/38 |
| 4,012,761 | 3/1977 | Ferro et al. | 357/38 |

FOREIGN PATENT DOCUMENTS

| 2,300,754 | 7/1974 | Germany | 357/38 |
| 2,346,237 | 3/1975 | Germany | 357/38 |
| 2,346,256 | 3/1975 | Germany | 357/38 |
| 2,511,281 | 9/1975 | Germany | 357/38 |
| 1,240,510 | 7/1971 | United Kingdom | 357/38 |

Primary Examiner—Stanley D. Miller, Jr.
Assistant Examiner—Joseph E. Clawson, Jr.
Attorney, Agent, or Firm—C. L. Menzemer

[57] ABSTRACT

The present invention pertains to a light activated thyristor which increases the current density of light-generated carriers by means of a low resistance path from an area of carrier generation in a base zone of a first conductivity type into a portion of an adjacent emitter zone of a second conductivity type. In one embodiment the low resistance path takes the form of an annular gate electrode affixed to the base zone and having a projection bordering the base-emitter PN junction. In another embodiment the low resistance path takes the form of a ballast segment disposed in the base zone, the ballast segment having an opening for funnelling the carriers to the base-emitter PN junction.

7 Claims, 7 Drawing Figures

LIGHT ACTIVATED THYRISTOR CAPABLE OF ACTIVATION BY INTENSITY RADIATION

BACKGROUND OF THE INVENTION

1. Field of the Invention

The present invention pertains to light activated semiconductor switching devices, and particularly to thyristors which can be fired by a light-emitting diode.

2. Description of the Prior Art

An important design criterion of light activated thyristors is the ability to be fired (triggered) by means of a low intensity radiation source, as for example, a light-emitting diode (LED). A disadvantage associated with such use of LED's to fire thyristors is the relatively low density of carriers generated in the semiconductor body, which results in a slow firing rate. It is known that slow firing causes hot-spots in the semiconductor body due to high load current densities at random points where initial conduction sets in, thereby damaging the thyristor. The present invention, therefore, is addressed to the problem of making a light activated thyristor which responds more effectively to a low intensity radiation source.

Prior art thyristors are provided with base-emitter short circuits (shunts), which improve $dv/dt$ response. Unfortunately, the shunts also drain off the light-generated carriers by providing low impedance paths to the emitter electrode directly from the area in the base where the carriers are generated. While it is true that a reduction in base-emitter shunting increases the current density of light-generating carriers passing through the base-emitter PN junction, such a reduction in shunting also adversely affects the $dv/dt$ response. Thus, those skilled in the art will recognize that a reduction in shunting is an impractical trade-off, and that a means of increasing the current density of light-generated carriers crossing the base-emitter PN junction is required, while at the same time maintaining adequate shunting.

SUMMARY OF THE INVENTION

In accordance with the present invention, a light-activated thyristor, which has an improved firing rate in response to low intensity radiation, comprises means providing a low resistance path from a source area of light-generated carriers to a portion of a PN junction adjacent to the source area, whereby the current density of carriers crossing the PN junction is sufficient to first the thyristor at the improved rate.

In one preferred embodiment, the low resistance path means comprises a gate electrode disposed between the source area and the PN junction, the gate electrode having a projection bordering from about one fourth to about one half the length of the PN junction.

In another embodiment, the low resistance path means comprises a ballast segment disposed between the source area and the PN junction, the ballast segment having an opening bordering from about one fourth to about one half the length of the PN junction.

In still another embodiment, the low resistance path means comprises a ballast segment disposed between the source area and the PN junction, and a gate electrode in juxtaposition over the ballast segment, the ballast segment having an opening, the gate electrode having a projection in juxtaposition over the opening, the projection bordering from about one fourth to about one half the length of the PN junction.

In a further embodiment, the low resistance path means comprises a closed-loop ballast segment surrounding the source area, and a gate electrode in juxtaposition over the ballast segment, the gate electrode having a projection overlapping the ballast segment, the projection bordering from about one fourth to about one half the length of the PN junction.

DESCRIPTION OF THE PREFERRED EMBODIMENT

Figure 1:
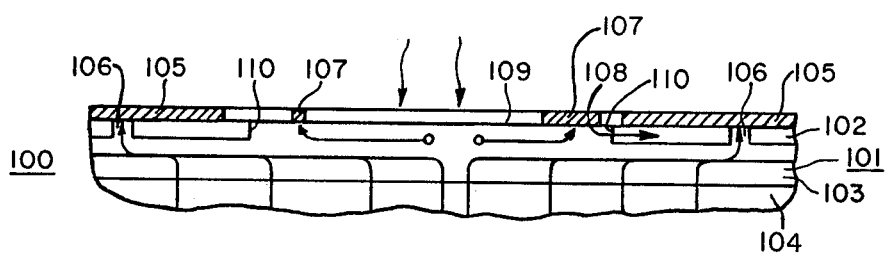
FIGS. 1 and 2 are respectively a partial cross-section and a partial plan view of a first preferred embodiment of the present invention.
Figure 2:
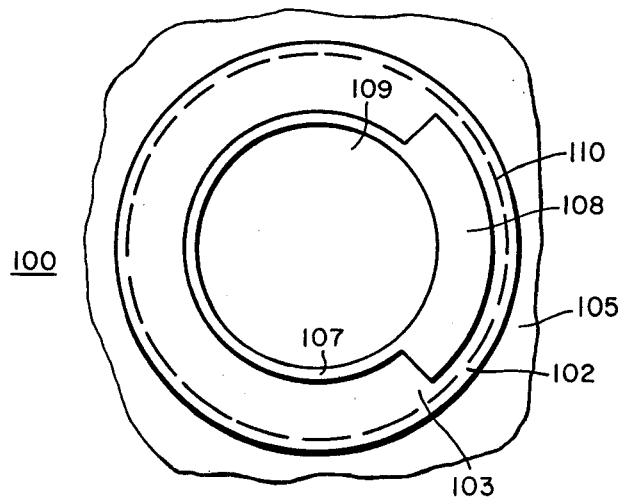

Referring to FIGS. 1 and 2, a portion of a light activated thyristor 100 illustrates a first preferred embodiment of the invention. The thyristor 100 comprises a body 101 of semiconductor material typically having four zones of alternate conductivity type produced in a known manner, only three of which are explicitly shown for ease of illustration. An emitter zone 102 of a first conductivity type is situated in body 101 adjacent to a top major surface of the body 101. A base zone 103 of a second conductivity type is situated beneath emitter zone 102. An interior zone 104 of the first conductivity type is situated beneath the base zone 103. There is at least one additional zone (not shown) situated beneath zone 104, such as an anode zone of the second conductivity type bordering a bottom major surface (not shown) of the body 101. An emitter electrode 105 is affixed to the body 101 contacting the emitter zone 102 and small shunt portions 106 of the base zone 103, the shunts 106 providing base-emitter short circuits known in the art. A gate electrode 107 is affixed to the body 101 contacting the base zone 103 as shown. The gate electrode 107 takes the shape of a closed-loop or annulus having a projection 108 extending outward. The gate electrode 107 encompasses a portion 109 of the top major surface above the base zone 103, which constitutes a source area of light-generated carriers. Associated with the thyristor 100 is a means (designated by the superimposed arrows) for illuminating the base zone 103 with low intensity radiation, comprising for example a LED. Interfacing base zone 103 and emitter zone 102 is a PN junction 110, which preferably forms a closed-loop at its intersection with the top major surface of body 101, thereby circumscribing the gate electrode 107 and the carrier source area 109 therein. The projection 108 borders a fractional portion of the closed-loop of the PN junction 110, the separation distance between the projection 108 and the PN junction 110 being uniform as shown.

When source area 109 is illuminated with low intensity radiation, pairs of charge carriers are produced in the base zone 103 within the annular gate electrode 107. Carriers of one polarity travel to the electrode 107, which causes a current to flow through the projection 108 into the narrow strip of base zone 103 between the projection 108 and the PN junction 110. The current density is thereby concentrated by the shape of the electrode 107. The concentrated current then flows through PN junction 110 into emitter zone 102 and from there into emitter electrode 105. Projection 108, being metallic, provides a low resistance path relative to the semiconductor material of base zone 103 surrounding the electrode 107. Consequently, most of the light-generated current flows via projection 108 through PN junction 110. Furthermore, since the projection 108 borders a fractional portion of the length of the surrounding PN juncton 110, the current density through the PN junction 110 is sufficient to fire the thyristor 100 at a rate faster than a similar prior art device without the projection 108. Thus, the incidence of load current hot-spotting found in slower prior art devices is substantially reduced in thyristors of the present invention. The fractional portion of the length of the PN junction 110 bordered by projection 108 should be less than one half the total length of the intersection of PN junction 110 with the surface of body 101 along a line immediately surrounding the gate electrode 107. Preferably, however, projection 108 borders about one fourth such length of PN junction 110 at the surface.

When thyristor 100 is operating under load conditions, emitter electrode 105 is connected to an external circuit while gate electrode 107 remains free floating. Therefore, any changes in circuit voltage ($dv/dt$) are impressed on thyristor 100 at emitter electrode 105. Semiconductor body 101 has a capacitance which results in a current in the presence of a $dv/dt$. As shown by the arrowpaths in FIG. 1, such $dv/dt$ current, as long as it does not lead to turn-on, flows upward into base zone 103 and then essentially symmetrically radially outward and through shunts 106 to the emitter electrode 105. The projection 108 has in this case no influence on the current distribution. Only when the $dv/dt$-current becomes so high that the current fraction flowing into emitter 110 will reach the same order of magnitude as that flowing into the shunts 106, will the current begin to flow preferably through projection 108. Thus for very high $dv/dt$ thyristor 100 has a somewhat increased sensitivity to $dv/dt$ firing in comparison to prior art thyristors.

Figure 3:
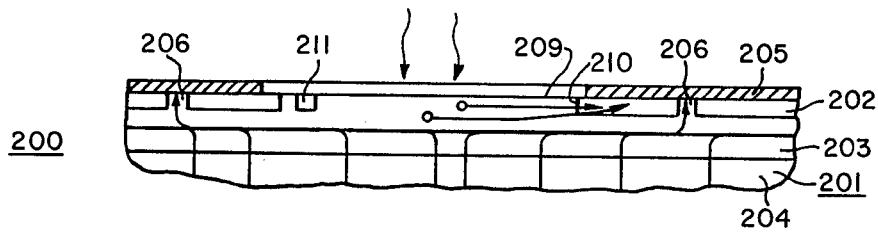
FIGS. 3 and 4 are respectively a partial cross-section and a partial plan view of a second embodiment of the present invention.
Figure 4:
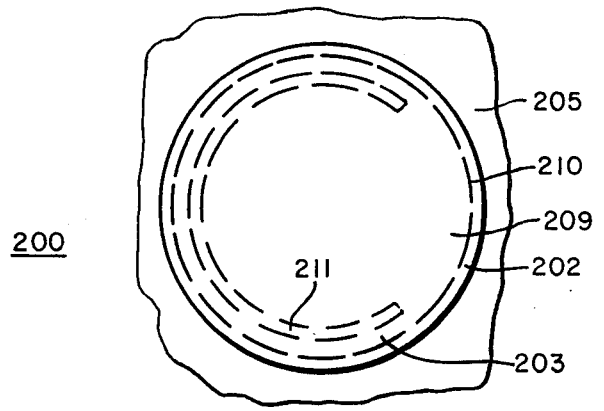

Now referring to FIGS. 3 and 4, wherein similar numerals designate similar parts, a thyristor 200 is shown which has an alternate means for providing a low resistance path for light-generated carriers. A relatively low resistance path is created by increasing the resistance around source area 209 by means of a ballast segment 211 of the same conductivity type as emitter zone 202. As seen in FIG. 4, ballast segment 211 is C-shaped, which provides an opening as a low resistance path means from the source area 209 to the PN junction 210. Preferably the ballast segment 211 surrounds most of the source area 209, such that the opening borders about one fourth of the length of the PN junction 210 surrounding the ballast segment 211. Ballast segment 211 can be formed by known masking techniques simultaneously with the diffusion of emitter zone 202.

The functioning of thyristor 200 is analogous to that of thyristor 100. When source area 209 is illuminated with low intensity radiation, carriers are generated which flow via the relatively low resistance path of the opening in ballast segment 211 through the portion of PN junction 210 bordering the opening. The current density is thereby concentrated in the low resistance path causing firing to occur at an improved rate similarly as described above.

Figure 5:
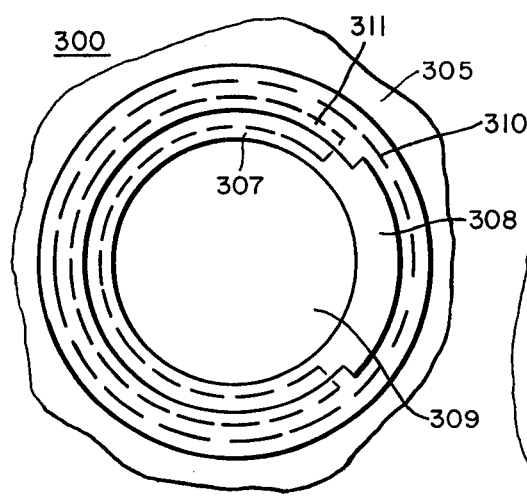
FIG. 5 is a plan view of a third embodiment of the present invention.

Now referring to FIG. 5, similar numerals designating similar parts, a thyristor 300 is shown which essentially combines both low resistance path means of thyristors 100 and 200. Gate electrode 307 lies in juxtaposition over ballast segment 311, such that gate electrode 307 overlaps the inner portion of ballast segment 311 and the adjacent source area 209 disposed within the ballast segment 311 as shown. Projection 308 lies in juxtaposition over an opening in the ballast segment 311.

Figure 6:
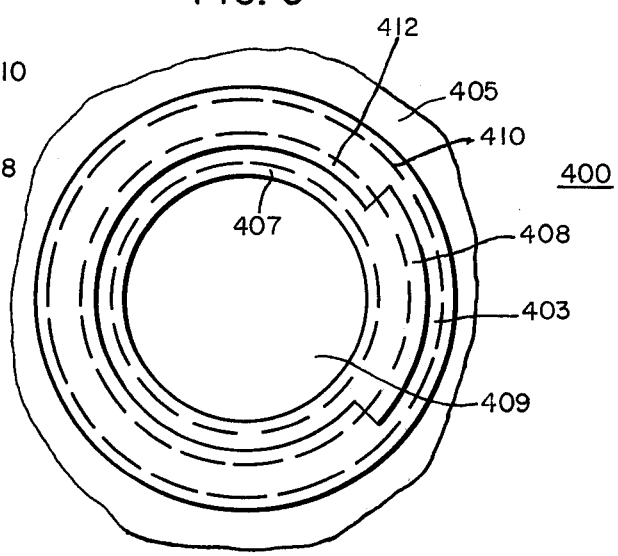
FIG. 6 is a plan view of a fourth embodiment of the present invention.

Now referring to FIG. 6, similar numerals designating similar parts, a thyristor 400 is shown which is a slight structural modification of thyristor 300 of FIG. 5. Thyristor 400 of FIG. 6 has a closed-loop ballast segment 412 surrounding source area 409. Gate electrode 407 lies in juxtaposition over ballast segment 412, gate electrode 407 having a projection 408 overlapping the ballast segment 412 to provide a low resistance path from source area 409 to a portion of PN junction 410 bordering the projection 408.

Figure 7:
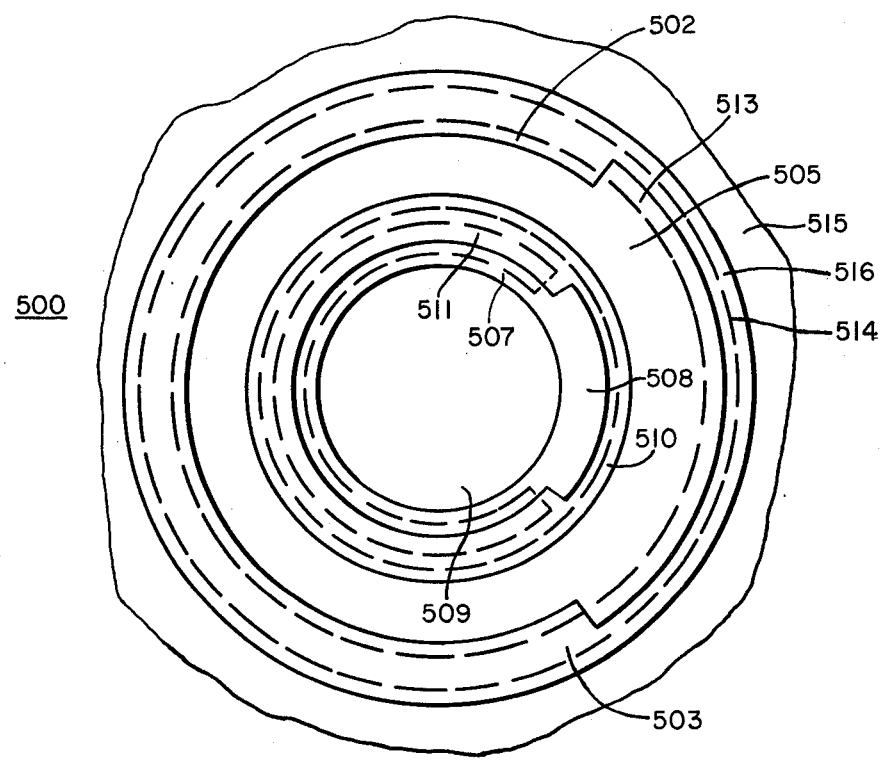
FIG. 7 is a plan view of an embodiment of the present invention having an auxiliary thyristor.

Now referring to FIG. 7, similar numerals designating similar parts, a thyristor 500 is shown which incorporates by way of example the low resistance path means of thyristor 300 into a thyristor structure having a so-called amplifying gate structure or integrated auxiliary thyristor structure. Thyristors with amplifying gates are known in the art. It is to be understood that any one of the embodiments described above can be successfully combined with an amplifying gate thyristor. In particular, thyristor 500 comprises a secondary emitter electrode 505 affixed to secondary emitter zone 502, and an amplifying gate electrode 515 affixed to an auxiliary emitter zone 516. The amplifying gate electrode 515 fires the main thyristor (not shown) in a known manner. The electrode 505 has a projection 513 extending from zone 502 into the base zone 503 thereby bordering PN junction 514. The projection 513 is symmetrically disposed radially outward from projection 508, but could also be positioned at any angle.

When thyristor 500 is forward biased and source area 509 is illuminated with low intensity radiation, carriers are generated which flow via projection 508 through PN junction 510 thereby firing emitter 502. An amplified firing current then flows through projection 513 to fire emitter 516, which in turn provides symmetrically amplified firing of the main thyristor.

If the ratio of lengths of projections 508 and 513 is approximately 1:2 or larger, the auxiliary emitter 516 will fire before emitter 510. Emitter 510 then acts as a current amplifier just during the turn-on delay phase, increasing the gate current density in emitter 516 before turn-on. Emitter 510 will thus not have to carry a current with high current density after the device has turned on.

Variations of the above-described preferred embodiments will readily occur to those skilled in the art. For example, an etched depression or moat can replace the ballast segment. However, these and other variations of structure to achieve equivalent functions are contemplated to be within the scope of the appended claims.

What is claimed is:

1. A light activated thyristor comprising:
  a. a body of a semiconductor material; said body comprising an emitter zone of a first conductivity type adjacent to a major surface of said body, a base zone of a second conductivity type adjacent to said emitter zone and sharing a portion of said major surface with said emitter zone, a PN junction interfacing said base zone and said emitter zone and intersecting said major surface between emitter and base zones, said base zone having an area at said major surface for receiving low intensity radiation, said area being a source of carriers generated by said radiation; and, b. means for providing a low resistance path for carriers in said source area in said base zone to said PN junction without contacting an emitter zone, such that radiation-generated carriers in said source area are concentrated in said path while flowing to said PN junction.

2. The thyristor of claim 1 wherein said low resistance path means comprises a gate electrode disposed between said source area and said PN junction, said gate electrode having a projection bordering from about one fourth to about one half the length of said PN junction intersection with said major surface.

3. The thyristor of claim 1 wherein said low resistance path means comprises a ballast segment disposed between said source area and said PN junction, said ballast segment having an opening bordering from about one fourth to about one half the length of said PN junction intersection with said major surface.

4. The thyristor of claim 1 wherein said low resistance path means comprises a ballast segment disposed between said source area and said PN junction, and a gate electrode in juxtaposition over the ballast segment, said ballast segment having an opening, said gate electrode having a projection in juxtaposition over said opening, said projection bordering from about one fourth to about one half the length of said PN junction intersection with said major surface.

5. The thyristor of claim 1 wherein said low resistance path means comprises a closed-loop ballast segment surrounding the source area, and a gate electrode in juxtaposition over said ballast segment, said gate electrode having a projection overlapping said ballast segment, said projection bordering from about one fourth to about one half the length of said PN junction intersection with said major surface.

6. The thyristor of claim 1 further comprising means for amplifying a firing current from said emitter zone to a larger surrounding emitter zone.

7. The thyristor of claim 6 wherein said amplifying means comprises an outer metallic projection symmetrically disposed radially from an inner metallic projection, said outer projection length is about twice said inner projection length.

* * * * *